United States Patent [19]
Cho et al.

[11] Patent Number: 5,903,037
[45] Date of Patent: May 11, 1999

[54] GAAS-BASED MOSFET, AND METHOD OF MAKING SAME

[75] Inventors: Alfred Yi Cho, Summit; Minghwei Hong, Watchung, both of N.J.; James Robert Lothian, Bethlehem, Pa.; Joseph Petrus Mannaerts, Summit; Fan Ren, Warren, both of N.J.

[73] Assignee: Lucent Technologies Inc., Murray Hill, N.J.

[21] Appl. No.: 08/804,782

[22] Filed: Feb. 24, 1997

[51] Int. Cl.$^6$ .......................... H01L 21/316; H01L 23/58
[52] U.S. Cl. .......................... 257/410; 257/289; 257/631; 438/606; 438/779; 438/767; 438/236
[58] Field of Search .................................. 257/410, 289; 438/606, 779

[56] References Cited

U.S. PATENT DOCUMENTS

| | | | |
|---|---|---|---|
| 5,451,548 | 9/1995 | Hunt et al. | 437/225 |
| 5,497,024 | 3/1996 | Shibuya et al. | 257/410 |
| 5,550,089 | 8/1996 | Dutta et al. | 437/225 |
| 5,821,171 | 10/1998 | Hong et al. | 438/767 |

OTHER PUBLICATIONS

Ren F. et al. Ga O (Gd O )/InGaAs Enhancement–Mode n–channel MOSFET's, IEEE, Electrode device letters, vol. 19, No. 8 pp. 309–311, Aug. 1998.

Kim et al. GaAs MOSFET using MBE–grown Ga O (Gd O) as gate oxide, IEE Proc. Circuits Device Syst., vol. 145, No. 3 pp. 162–164, Jun. 1998.

Ren, F. et al., "Enhancement–Mode p–Channel GaAs MOSFETs on Semi–Insulating Substrates", IEDM 96, Dec. 8–11, 1996, pp. 943–945.

Ren, F. et al., "III–V Compound Semiconductor MOSFETs Using $Ga_2O_3(Gd_2O_3)$ As Gate Dielectric", GAAS IC Symposium, IEEE Gallium Arsenide Integrated Circuit Symposium, 19th Annual Technical Digest 1997 (Cat. No. 97CH36098), Anaheim, CA, ISBN 0–7803–4083–3, 1997, New York, NY, pp. 18–21, XP002063296.

Hong, M. et al, "Low Interface State Density Oxide–GaAs Structures Fabricated by in situ Molecular Beam Epitaxy", 15th North American Conference on Molecular Beam Epitaxy, College Park, MD, Sep. 1995, ISSN 0734–211X, J. of Vacuum Science & Technology B (Microelectronics and Nanometer Structures), May–Jun. 1996, AIP for American Vacuum Soc., pp. 2297–2300 XP002064492.

Hong, M. et al, "Novel $Ga_2O_3(Gd_2O_3)$ Passivation Techniques To Produce Low $D_{it}$ oxide–GaAs Interfaces", Proceedings of the Ninth Intn'l Conf. On Molecular Beam Epitaxy, Malibu, CA, Aug. 5–9 1996, vol. 175–176, Pt. 1, ISSN 0022–0248, J. of Crystal Growth, May 1997, Elsevier, Netherlands, pp. 422–427, XP002063295.

Hong, M. et al., "Novel Heterostructures Produced Using In–Situ Molecular Beam Epitaxy", Procedings of the 24th State–of–the–Art Program on Compound Semiconductors, Proceedings of State–of–the–Art Program on Compound Semiconductors XXIV (ISBN 1 56677 152 8), Los Angeles, CA, USA, May 5–10, 1996, Pennington, NJ Electrochem. Soc., pp. 36–48, XP002063297.

Primary Examiner—Peter Toby Brown
Assistant Examiner—Hung Van Duong
Attorney, Agent, or Firm—Eugen E. Pacher

[57] ABSTRACT

It has been found that a Ga-oxide-containing layer is substantially not etched in HF solution if the layer is a Ga-Gd-oxide with Gd:Ga atomic ratio of more than about 1:7.5, preferably more than 1:4 or even 1:2. This facilitates removal of a protective dielectric (typically $SiO_2$) layer after an ohmic contact anneal, with the Ga-Gd-oxide gate oxide layer serving as etch stop and not being adversely affected by contact with the HF etchant. Gd-Ge-oxide also exhibits a composition-dependent etch rate in $HCl:H_2O$.

2 Claims, 4 Drawing Sheets

GAAS-BASED MOSFET, AND METHOD OF MAKING SAME

FIELD OF THE INVENTION

This invention pertains to GaAs-based metal-oxide-semiconductor field effect transistor (MOSFETs), and to methods of making such MOSFETs.

BACKGROUND

It is widely recognized that GaAs MOSFETs potentially could have desirable properties, e.g., speed in excess of that of conventional (Si-based) MOSFETs, low power consumption and circuit simplicity (if complementary MOSFETs were available). However, until recently attempts to make such devices did not result in devices having commercially acceptable properties, typically due to low quality of the gate oxide. In particular, acceptable enhancement mode devices were not available.

Recently significant progress was made towards solution of the gate oxide problem. See, for instance, U.S. patent application Ser. No. 08/408,678, filed Mar. 22, 1995 by M. Hong et al. See also U.S. Pat. Nos. 5,550,089 and 5,451,548. Indeed, U.S. patent application Ser. No. 08/741,010, filed Oct. 31, 1996 by Y. K. Chen et al., discloses a planar, enhancement mode GaAs MOSFET with inversion channel, and a method of making the MOSFET. Such a device is particularly desirable for circuit applications. It is "normally off", i.e., non-conducting with zero applied gate voltage. All of the above cited patents and patent application are incorporated herein by reference.

Despite the recent advances, it would still be desirable to provide improved GaAs-based MOSFETs, including planar, enhancement mode GaAs-based MOSFETs, and/or an improved method of making such MOSFETs. This application discloses such a device and such a method of making the device.

SUMMARY OF THE INVENTION

Although the method of the '010 patent application can be used to produce planar enhancement mode GaAs MOSFETs of substantially improved quality, as compared to such prior art devices, further improvement would be desirable. In particular, it would be desirable to be able to reduce the resistance of the source and drain contacts. We have discovered a technique for doing so. The technique is based on our discovery that the etch rate of Ga-Gd-oxide in HF solution depends strongly on the Gd concentration in the oxide, with high Gd-content oxide being substantially insoluble in the HF solution, whereas $SiO_2$ is readily etched in the solution. This facilitates removal of a protective $SiO_2$ layer after an ohmic contact anneal, with the Ga-Gd-oxide serving as etch stop and not being adversely affected by contact with the etchant.

Herein we use the term Ga-Gd-oxide (or Gd-Ga-oxide) to refer to a mixed oxide that contains Ga, Gd and oxygen, with the amount of oxygen not necessarily being the stoichiometric amount corresponding to a mixture of $Ga_2O_3$ and $Gd_2O_3$. Indeed, there are indications that the amount of oxygen is typically sub-stoichiometric.

The invention is embodied in an article that comprises a GaAs-based MOSFET comprising a GaAs substrate having a major surface, two spaced apart regions of a first conductivity type extending from the major surface into the substrate (designated "source" and "drain", respectively), a metal contact disposed on each of said source and drain, with an oxide layer (designated "gate oxide") disposed on the major surface between the source and the drain, and with a gate metal contact disposed on the gate oxide layer.

Desirably, the MOSFET is a planar device (i.e., the semiconductor surface is planar, substantially without etched recesses or epitaxial regrowth). The source and drain regions extend into GaAs material of a second conductivity type, the gate oxide layer is a Ga-containing oxide. Associated with the gate oxide/semiconductor interface typically is a midgap interface state density of at most $5 \times 10^{10}$ $cm^{-2}eV^{-1}$, and the MOSFET is an enhancement mode MOSFET adapted for forming a first conductivity type channel between source and drain upon application of a voltage to the gate metal contact.

Significantly, the gate oxide is Ga-Gd-oxide having a Gd:Ga atomic ratio of more than 1:7.5, preferably more than 1:4 or even 1:2, exemplarily about 1:1. Choice of such relatively Gd-rich gate oxide facilitates a method of making the MOSFET that comprises a heat treatment step for alloying the ohmic metal contacts. The gate oxide composition typically is substantially constant as a function of distance from the interface. This is a significant difference from, e.g., the device of the '678 application which is required to have a gate oxide layer that is substantially free of Gd at least at the gate oxide/semiconductor interface.

The invention is also embodied in a method of making the above disclosed article. The method comprises providing a GaAs body having a major surface, with dopant atoms distributed in a source contact region and a drain contact region of the body. It also comprises a dopant activation anneal, followed by reconstruction of the GaAs surface and deposition of a gallium-containing gate oxide on the surface. After removal of the gallium-containing oxide overlying the source and drain contact regions, contact metal is deposited onto the contact regions, and gate metal is deposited on the gate oxide.

Significantly, the Ga-containing gate oxide is Ga-Gd-oxide having a Gd:Ga atomic ratio of more than 1:7.5, 1:4 or even 1:2, exemplarily about 1:1. Furthermore, the method comprises depositing, subsequent to the contact metal deposition and before gate metal deposition, a protective dielectric (exemplarily $SiO_2$) onto the surface, annealing the article to provide ohmic source and drain contacts, and removing the $SiO_2$ from the source, drain and gate contacts, typically by etching in an aqueous HF solution. The method can be readily adapted for manufacture of complementary MOSFETs on a common substrate, and/or for manufacture of MOSFETs and MESFETs on a common substrate.

DETAILED DESCRIPTION OF AN EXEMPLARY EMBODIMENT

Figure 1:
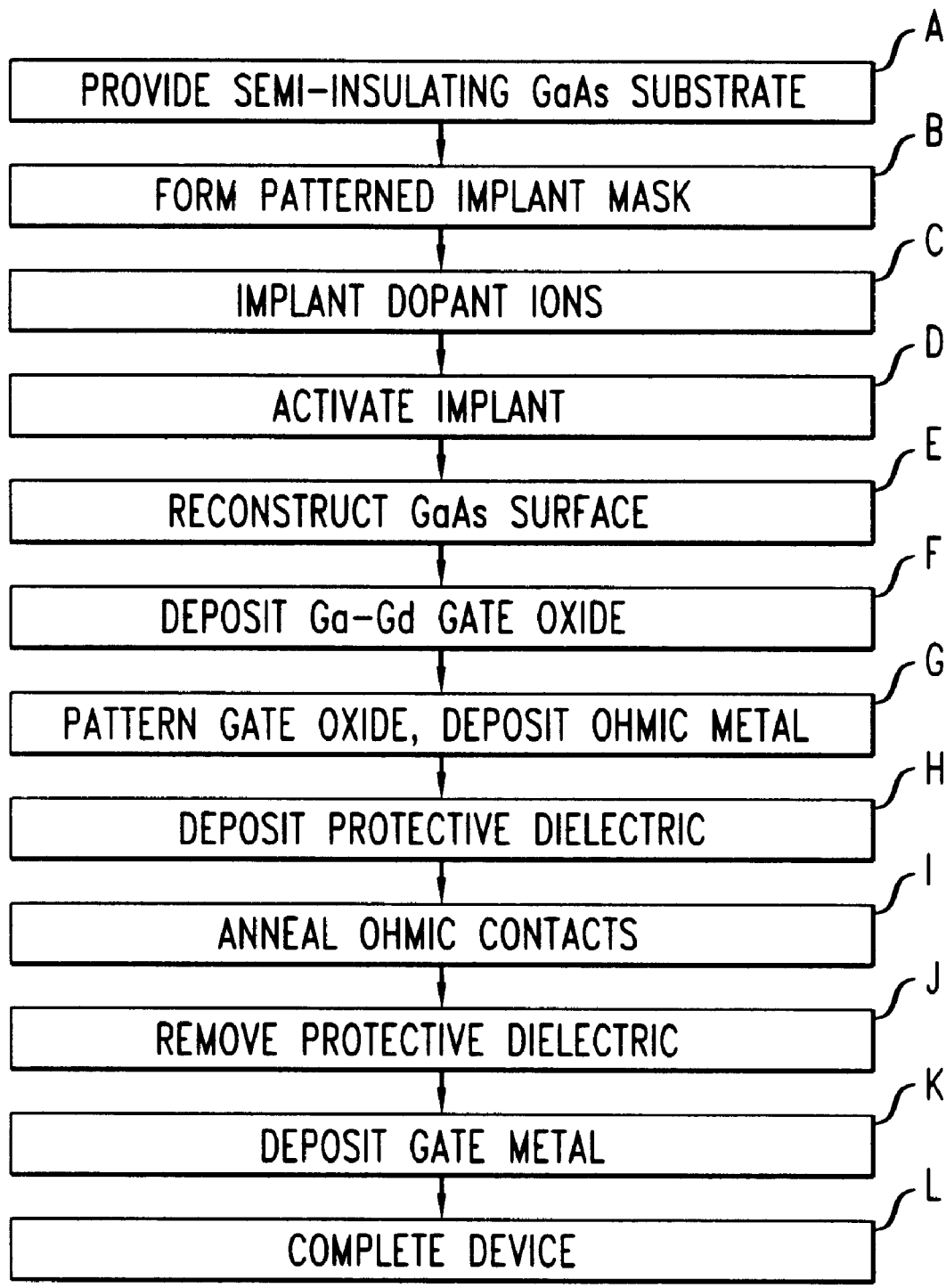
FIG. 1 shows, in form of a flow chart, an embodiment of the inventive method.

FIG. 1 schematically shows in flow chart form significant steps of the instant inventive method of making a GaAs MOSFET. Steps A–D are substantially as described in the above referenced '010 patent application. Steps E and F correspond substantially to steps F and G of '010, and step G corresponds substantially to step H of '010.

Steps A and B of FIG. 1 respectively require provision of a GaAs substrate and formation of a patterned implant mask. The substrate typically is a conventional semi-insulating GaAs wafer, but could be such a wafer with one or more epitaxial layers thereon. For the sake of concreteness, the discussion below will be in terms of a conventional (100) semi-insulating GaAs substrate.

Formation of a patterned implant mask exemplarily involves deposition of a thin layer of dielectric material (e.g., $SiO_2$, $SiN_x$, $SiO_yN_z$, x<4/3, y<2, z<4/3, exemplarily 40–200 nm thick) on the major surface of the substrate, deposition of a conventional photoresist layer on the dielectric layer, and patterning of the photoresist layer such that appropriate windows are formed through the photoresist to the dielectric. This is followed by ion implantation (see step C) into the GaAs material that underlies the windows. Steps B and C will typically be repeated one or more times, to attain the desired dopant distribution. Provision of the dielectric layer is optional but preferred.

Exemplarily, n-type regions are formed by implantation of Si or S through the dielectric layer in photoresist-defined areas of the wafer, and p-type regions are formed by Be or Zn implantation.

Step D of FIG. 1 involves annealing of the ion implanted substrate under conditions effective for activating the implanted ions, with or without a dielectric layer on the substrate. With retained dielectric layer the implant activation anneal exemplarily is accomplished in rapid thermal anneal (RTA) apparatus, typically at a temperature in the range 780–860° C. for a time in the range 2–5 minutes. Alternatively and preferably, the dielectric layer is removed (e.g., with HF), and the wafer is heated in an evacuable reactor to a temperature in the above range, with the wafer in contact with an As-containing atmosphere. Exemplarily, when the wafer reached 300° C., the wafer was maintained at that temperature for 5 minutes under flowing $H_2$, followed by heating to 825° C. under $H_2$ and $AsH_3$ ($H_2$:$AsH_3$ flow 70:1). The wafer was maintained at 825° C. for 5 minutes, followed by cooling to room temperature. As an alternative to the use of $H_2$ + arsine, elemental arsenic vapor could be used. Desirably the atmosphere contains enough As or As-containing species (e.g., arsine) to prevent net loss of As from the substrate surface. The required partial pressure of As or As-containing species depends inter alia on the annealing temperature, and thus cannot be specified in generality. However, a minor amount of experimentation will typically suffice to determine appropriate conditions. Exemplarily, we have achieved substantially 100% activation of implanted Be, with essentially no net loss of As from the wafer surface, when annealing the wafer at 825° C. for 5 minutes under 45 Torr of arsine and $H_2$ (about 1:70 flow rate ratio).

Step E of FIG. 1 involves removal of native oxides (and possibly other contaminants) from the wafer surface. The removal has to be carried out such that an essentially atomically clean, essentially atomically ordered, surface results. Creation of such a "reconstructed" surface is an important aspect of the process. It can be accomplished in any appropriate manner, and will typically be carried out under high vacuum (e.g., pressure $\leq 10^{-8}$ Torr). Among currently preferred techniques for producing a reconstructed GaAs surface are thermal desorption (e.g., 5 minutes at 580° C., As overpressure at $10^{-6}$ Torr to protect the wafer surface), and low damage dry etching techniques such as ECR with $H_2$ plasma or atomic hydrogen.

The meaning of "essentially atomically clean" and "essentially atomically ordered" is as defined in the '010 application. For instance, a (100) surface is essentially atomically clean if surface coverage by impurity atoms is less than 1% of a monolayer, and is essentially atomically ordered if a 2×4 or 4×6 surface reconstruction is observed. Those skilled in the art are familiar with this terminology.

After completion of surface reconstruction, the gate oxide layer is formed (step F of FIG. 1) in situ on the reconstructed surface, i.e., without removal of the wafer from the high vacuum. Not only is the oxide layer grown in situ, but the time between completion of surface reconstruction and commencement of oxide deposition is desirably kept to a minimum, in order to avoid significant (e.g., in excess of 100 Langmuirs) contamination of the surface. The oxide layer thickness will typically be in the approximate range 5–150 nm. In a currently preferred embodiment, the oxide layer is formed by e-beam deposition from a single crystal $Ga_5Gd_3O_{12}$ (GGG) source. Although to date e-beam deposition from a single crystal GGG source has provided the best gate oxide, it can not be precluded that other deposition techniques and/or other source materials (e.g., polycrystalline GGG) might also yield acceptable results.

Exemplarily the wafer is maintained at a temperature in the range from room temperature (20° C.) to 65° C. during gate oxide deposition. The oxide typically is deposited substantially uniformly over the whole wafer surface, but deposition could, at least in principle, be limited to particular portions of the surface, these portions including the gate region between source and drain of at least one MOSFET.

Subsequent to gate oxide deposition, the oxide is patterned to expose the previously formed contacts of the MOSFETs, as indicated by step G of FIG. 1. The patterning can be done using conventional photolithography, followed by etching in a HCl solution (e.g., 1 HCl:3$H_2O$).

Figure 4:
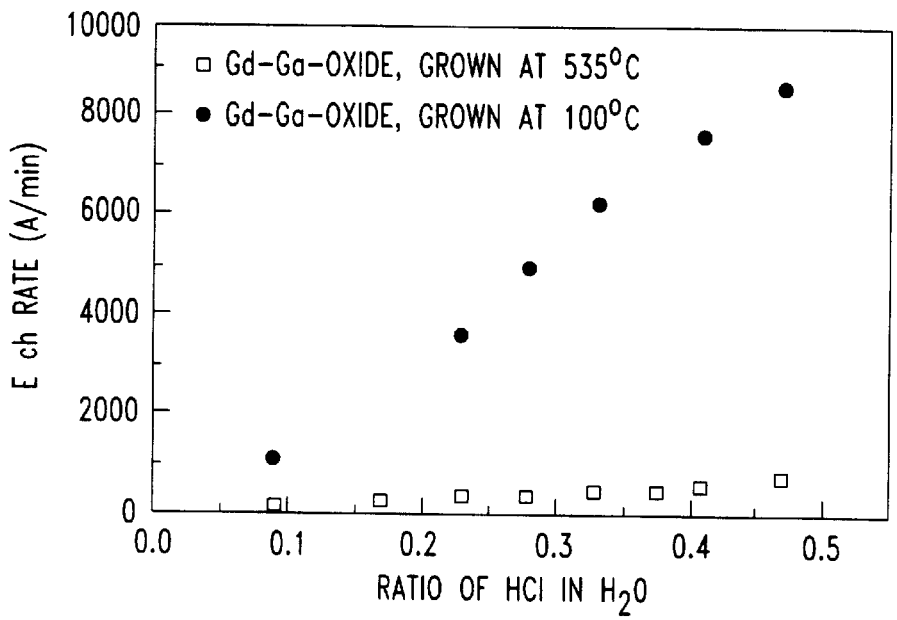
FIG. 4 shows data on the etch rate of Gd-Ga-oxide in HCl solutions.
Figure 8:
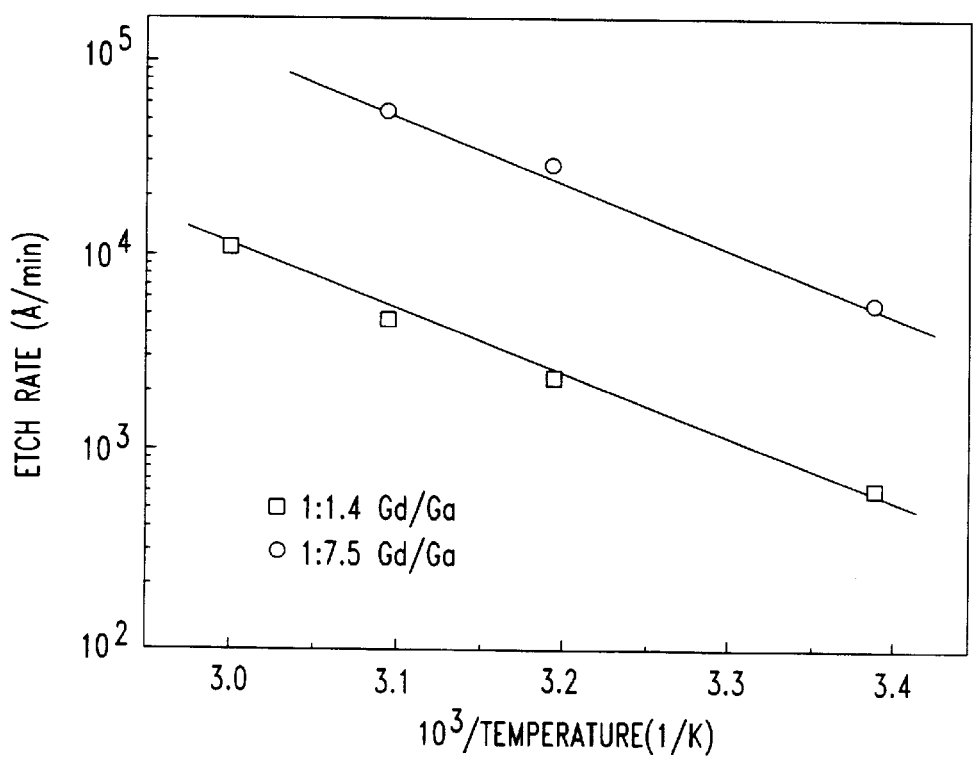
FIG. 8 shows Arrhenius plots of Gd-Ga-oxide etched in $HCl:H_2O$ solution.

FIG. 4 shows data on the etch rate of Gd-Ga-oxide in aqueous HCl solutions. As is evident from the data, the etch rate decreases with increasing Gd-content. This is considered to be a significant finding that is likely to facilitate processing of devices according to the invention, especially in light of the data of FIG. 8, which establishes that the etching of Gd-Ga-oxide in HCl solutions is a reaction-limited process, and thus can yield spatially uniform material removal without agitation.

Patterning of the gate oxide layer is followed by ohmic contact metallization (source, drain and, optionally, channel contact), also per step G of FIG. 1. Metallization can be conventional.

Step H of FIG. 1 comprises deposition of a protective dielectric layer, e.g., 40 nm $SiO_2$, followed by ohmic contact anneal (e.g., 400° C. for 1 minute, He atmosphere), per step I of FIG. 1. After completion of the anneal, the protective dielectric layer is removed from at least the contacts, advantageously with an HF solution (Step J). Dielectric removal is followed by gate metal deposition (Step K). This can be conventional. Exemplarily this step can also include formation of interconnections, including providing connections to channel, source, drain and gate contacts of the various MOSFETs on a wafer.

Step L of FIG. 1 refers to a variety of, typically conventional, steps that will typically be required to complete an IC, e.g., testing, dicing of the wafer into chips, wire bonding, encapsulation, etc.

As discussed above, Step H of FIG. 1 involves deposition, by conventional means, of a protective dielectric layer that protects the underlying surface during a subsequent ohmic contact alloying step (I). In preferred embodiments the protective dielectric layer is $SiO_2$, exemplarily $SiO_2$ deposited by electron cyclotron resonance chemical vapor deposition (ECR-CVD). Other known deposition methods may also be useful. Furthermore, other stable dielectrics (e.g., $SiN_x$, $SiO_yN_z$, $x \leq 4/3$, $y<2$, $z<4/3$) may be potentially useful.

Ohmic metal alloying (Step I of FIG. 1) is typically carried out at temperatures above 350° C., exemplarily in the range 400±50° C. in He atmosphere.

Removal of the protective dielectric (Step J) is a critical step that must not damage the gate oxide. This is facilitated by appropriate choice of the gate oxide composition, namely, Ga-Gd-oxide having Gd:Ga ratio greater than 1:7.5, preferably greater than 1:4 or even 1:2.

We have discovered that the etch rate of Ga-Gd-oxide in HF solution depends significantly on the Gd content of the oxide. For instance, the etch rate of Gd-Ga-oxide with 1:7.5 Gd:Ga ratio is about 95 nm/min, and that of 1:1.4 Gd:Ga ratio is essentially zero, all in 1:10 $HF:H_2O$. Thus, HF solutions (e.g., 1 HF: $10H_2O$) can be used to efficiently remove the protective dielectric (typically $SiO_2$) layer that overlies the gate oxide, without significantly attacking the gate oxide, provided the gate oxide is Ga-Gd-oxide with Gd content as recited above.

Figure 2:
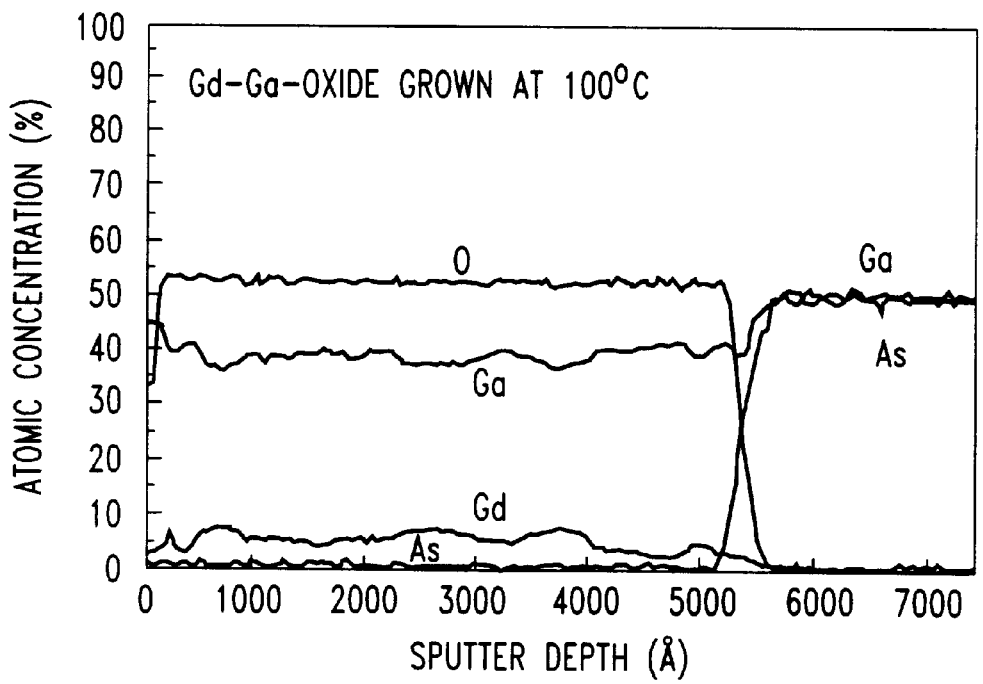
FIGS. 2 and 3 show the composition of Ga-Gd-oxide films deposited at different temperatures.
Figure 3:
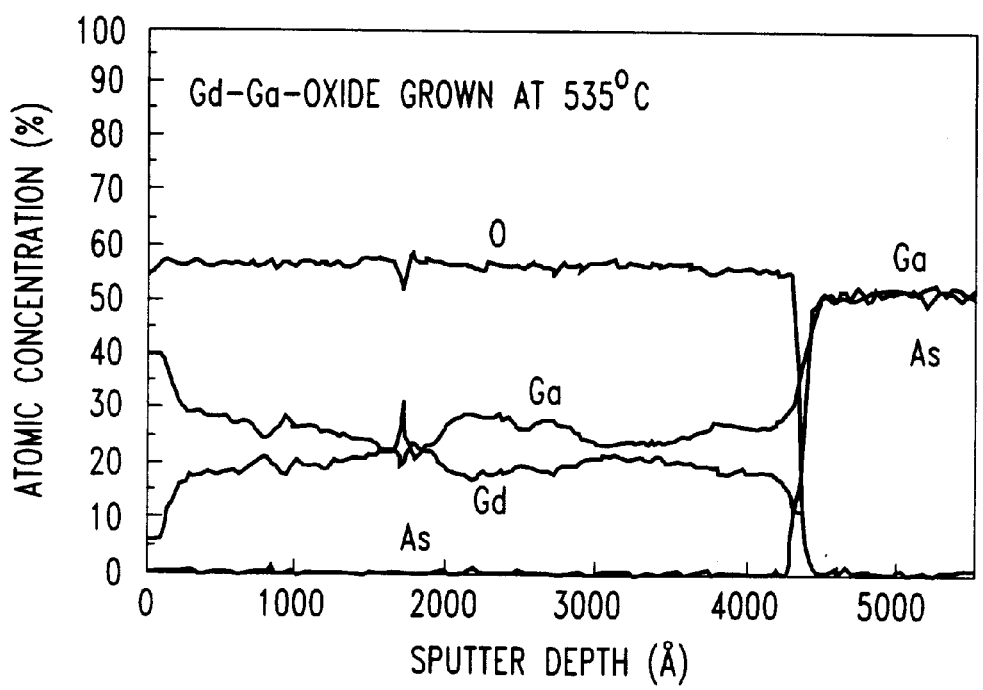

In preferred embodiments the Ga-Gd-oxide is deposited, e.g., by e-beam evaporation, from a single crystal $Gd_3Ga_5O_{12}$ (GGG) source. We have determined that the ratio between Gd and Ga in the deposited oxide inter alia depends on the substrate temperature during deposition. FIGS. 2 and 3 show Auger depth profiles of Ga-Gd-oxide films deposited at 100° C. and 535° C. substrate temperature, respectively, from a single crystal GGG source. The Gd:Ga ratio is about 1:1.4 at a substrate temperature of 535° C., and is about 1:7.5 at 100° C. Thus, Ga-Gd-oxide films vapor deposited from GGG that are useful in the practice of this invention require elevated substrate temperature during deposition, typically above about 100° C.

FIG. 4 shows preliminary data on the Gd-Ga dependence of the etch rate of Gd-Ga-oxide in HF solutions.

Figure 5:
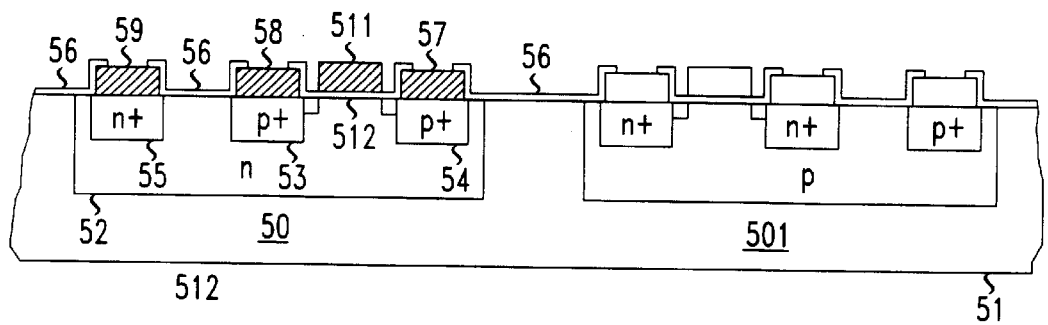
FIG. 5 schematically depicts a pair of complementary GaAs-based MOSFETs.

FIG. 5 schematically shows p-type MOSFET 50 and n-type MOSFET 501 in semi-insulating GaAs wafer 51. Numeral 52 refers to an n-type region of the substrate, in which the p-type device is formed. Numerals 53–55 refer to p-type drain, p-type source, and n-type channel contact region, respectively. Numeral 56 refers to the patterned Gd-Ga-oxide, and numerals 57, 58 and 59 refer to ohmic contacts. Numeral 51 refers to the gate contact metal. FIG. 5 does not enumerate the features of n-type MOSFET 501, since the features correspond to those of p-type MOSFET 50. Interconnections between devices 50 and 51 are also not shown, since they can be conventional.

Figure 6:
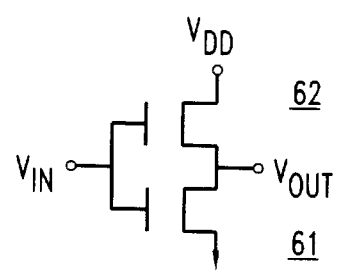
FIG. 6 schematically shows an exemplary circuit that comprises complementary MOSFE according to this invention.

MOSFETs as shown in FIG. 5 can be interconnected to form circuits, exemplarily as shown in FIG. 6. The inverter circuit of FIG. 6 comprises an n-channel enhancement mode GaAs MOSFET, and a p-channel enhancement mode GaAs MOSFET 62. The circuit of FIG. 6 is representative of circuits according to this invention.

Figure 7:
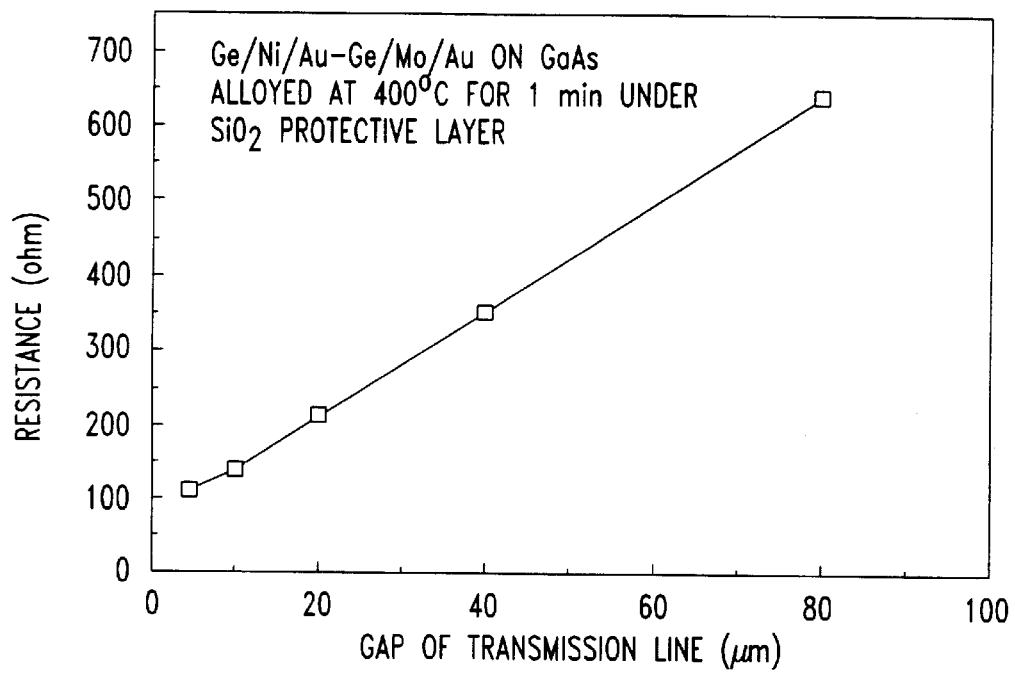
FIG. 7 shows some resistance data from conventional transmission line measurements.

FIG. 7 shows exemplary data on resistance, as obtained by a conventional transmission line technique. From the data can be extracted the contact resistance of an annealed (400° C. for 1 minute) contact (Ge/Ni/Au—Ge/Mo/Au) on GaAs, as described above. The contact resistance was about 1.5× $10^{-5}$ $\Omega \cdot cm^2$. The contact resistance can be readily reduced further by optimization of the implant conditions. The same contact metal, on GaAs without annealing, shows Schottky behavior, with very high (>1MΩ) resistance. Thus it is evident that the method according to the invention (which includes provision of a protective layer, typically $SiO_2$, before contact annealing) results in substantial improvement in device characteristics.

Example 1

A n-MOSFET was fabricated as follows. A semi-insulating (sheet resistivity $-10^8 \Omega \cdot cm$) (100)-oriented GaAs substrate was provided, and 50 nm $SiO_2$ was deposited on the substrate in conventional fashion. On the $SiO_2$ was formed an implantation mask (AZ-1818, 2.2 $\mu$m). This was followed by conventional Be (75 KeV, $2 \times 10^{13}/cm^2$) and Si (50 KeV, $8 \times 10^{12}/cm^2$) ion implantations to define the p-channel, $p^+$ channel contact, and $n^+$ source and drain regions. After implantation, the resist and $SiO_2$ were removed with acetone and HF solution ($1HF:1H_2O$). This was followed by implantation activation in a MOCVD system. The wafer was heated to 300° C., and $H_2$ was introduced. After 5 minutes at 300° C. under $H_2$, arsine was added to the atmosphere, and the temperature was gradually increased to 780° C., and maintained at that temperature for 5 minutes, followed by cooling to room temperature. The arsine to $H_2$ flow rate was 1:120 and system pressure was 45 Torr. Immediately after cool-down, the wafer was transferred to a MBE system for native oxide desorption, surface reconstruction and Gd-Ga-oxide deposition. The wafer was mounted on a molybdenum block with indium and heated to 580° C. for 5 minutes for oxide desorption. Arsenic over-pressure was maintained at $10^{-6}$ Torr to protect the wafer surface, and reflection high energy electron diffraction (RHEED) was used to monitor the wafer surface. After oxide desorption and surface reconstruction the wafer was transferred, under high vacuum ($10^{-10}$ Torr), to a second chamber for Gd-Ga-oxide deposition, where 40 nm of Gd-Ga-oxide was deposited by e-beam evaporation from a single crystal GGG source. Wafer temperature was 535° C., deposition rate was about 0.05 nm/second, and background pressure was $<10^{-9}$ Torr. After completion of gate oxide deposition, AZ-1818 was used for gate oxide patterning, with $1HCl:3H_2O$ used to selectively remove gate oxide to expose the source and drain contact regions. Contact metal (5 nm Ge/5 nm Ni/40 nm AuGe/20 nm Mo/200 nm Au) was deposited by electron beam evaporation. A conventional acetone lift-off technique was then used to remove the undesired metallization. This was followed by ECR deposition of 40 nm of $SiO_2$ on the entire wafer. The thus protected wafer was then subjected to a 400° C., 1 minute ohmic contact anneal. Subsequently, AZ 1811 (1.2 $\mu$m) was used to define gate and final metal contacts at the same time (25 nm Ti/50 nm Pt/300 nm Au, deposited by e-beam evaporation). This was followed by conventional acetone lift-off removal of unwanted metallization.

The thus produced n-MOSFET is subjected to electrical measurements and performs as expected.

Example 2

A pair of complementary MOSFETs on a common substrate is produced substantially as described above, except that the ion implantation is modified to produce implanted regions substantially as shown in FIG. 5. The pair of MOSFETs is connected as shown in FIG. 6 to form an inverter circuit. The circuit is tested and performs as expected.

Example 3

A multiplicity of n-MOSFETs, p-MOSFETs and n- and p-MESFETs are formed on a common substrate, substantially as described in Example 2, except that the gate oxide is removed from some of the n-type devices and some of the p-type devices, and 25 nm Ti/30 nm Pt/300 nm Au is deposited in the gate regions of these devices. After provision of conductive interconnects between the devices, the resulting circuit is tested and performs as expected.

The invention claimed is:

1. An article comprising a first GaAs-based metal/oxide/semiconductor field effect transistor ("MOSFET") comprising a GaAs substrate having a major surface, and further comprising two spaced apart regions of a first conductivity type extending from the major surface into GaAs material of a second conductivity type, said two regions to be designated source and drain region, respectively, with a metal contact disposed on each of the source and drain regions, with a Ga-containing oxide layer disposed on the major surface between the source region and the drain region, said oxide layer to be designated gate oxide layer, the gate oxide layer forming an interface with the major surface, and with a gate metal contact disposed on said gate oxide layer;

CHARACTERIZED IN THAT the gate oxide layer is a Gd-Ga-oxide having a Gd:Ga atomic ratio of more than 1:7.5.

2. Article according to claim 1, further comprising a second MOSFET having a source region and a drain region of the second conductivity type extending into GaAs material of the first conductivity type, said first and second MOSFETs disposed on a common substrate, with conductive connections between said first and second MOSFETs, the second MOSFET also comprising a Gd-Ga-oxide gate layer having a Gd:Ga atomic ratio of more than 1:7.5.

* * * * *